(12) United States Patent
Yamaguchi

(10) Patent No.: US 10,460,953 B2
(45) Date of Patent: Oct. 29, 2019

(54) SEMICONDUCTOR MANUFACTURING APPARATUS FOR MANUFACTURING A SEMICONDUCTOR DEVICE HAVING A HIGH-K INSULATING FILM, AND A METHOD FOR MANUFACTURING THE SEMICONDUCTOR DEVICE

(71) Applicant: HITACHI HIGH-TECHNOLOGIES CORPORATION, Minato-ku, Tokyo (JP)

(72) Inventor: Yoshihide Yamaguchi, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/904,878

(22) Filed: Feb. 26, 2018

(65) Prior Publication Data

US 2018/0308707 A1 Oct. 25, 2018

(30) Foreign Application Priority Data

Apr. 25, 2017 (JP) .................................. 2017-085910

(51) Int. Cl.
  *C23C 16/455* (2006.01)
  *H01L 21/02* (2006.01)
  (Continued)

(52) U.S. Cl.
  CPC .. *H01L 21/31122* (2013.01); *H01L 21/02181* (2013.01); *H01L 21/02183* (2013.01);
  (Continued)

(58) Field of Classification Search
  CPC ......... H01L 29/02; H01L 29/12; H01L 21/02; H01L 21/02019; H01L 21/022;
  (Continued)

(56) References Cited

U.S. PATENT DOCUMENTS 4,097,278 A * 6/1978 Bissonette ........... G03C 7/3017
  430/223
6,203,613 B1 * 3/2001 Gates .................... H01L 21/316
  117/104

(Continued)

FOREIGN PATENT DOCUMENTS

JP 2009-252895 A 10/2009
JP 2015-191922 A 11/2015

OTHER PUBLICATIONS

Steven George et al., "Thermal Atomic Layer Etching Using Sequential, Self-Limiting Fluorination and Ligand-Exchange Reactions", Proceeding of 38th International Symposium on Dry Process, Nov. 21-22, 2016, pp. 15-16.

*Primary Examiner* — Maliheh Malek
(74) *Attorney, Agent, or Firm* — Miles & Stockbridge PC

(57) ABSTRACT

Provided is a semiconductor manufacturing apparatus including: a container in which a processing chamber is installed; a stage installed in the processing chamber and configured to hold a semiconductor substrate; a gas supply line configured to supply reactive gas to the processing chamber; and a vacuum line configured to exhaust the processing chamber, wherein the semiconductor substrate includes a high-k insulating film, and as the reactive gas, mixed gas including complex-forming gas forming a volatile organometallic complex by reacting with a metal element included in the high-k insulating film and complex stabilizing material gas that increases stability of the organometallic complex is supplied.

7 Claims, 7 Drawing Sheets

(51) Int. Cl.
  *H01L 21/311* (2006.01)
  *H01L 21/67* (2006.01)
  *H01L 21/28* (2006.01)
  *H01L 29/51* (2006.01)
  *H01L 21/3065* (2006.01)

(52) U.S. Cl.
  CPC .. *H01L 21/02186* (2013.01); *H01L 21/02189* (2013.01); *H01L 21/02192* (2013.01); *H01L 21/28185* (2013.01); *H01L 21/31144* (2013.01); *H01L 21/67017* (2013.01); *H01L 21/6719* (2013.01); *H01L 21/67069* (2013.01); *H01L 29/517* (2013.01); *C23C 16/45559* (2013.01)

(58) Field of Classification Search
  CPC . H01L 21/027; H01L 21/033; H01L 21/3065; H01L 21/30655; H01L 21/308; H01L 21/311–31122; H01L 21/32136; H01L 21/67356; H01L 21/02172–02192; H01L 21/67–67011; C23C 14/083; C23C 16/18; C23C 16/45559; H01J 2237/334–3341
  See application file for complete search history.

(56) References Cited

U.S. PATENT DOCUMENTS

| | | | | |
|---|---|---|---|---|
| 6,273,951 B1* | 8/2001 | Vaartstra | ................ | C23C 16/40 117/104 |
| 6,753,245 B2* | 6/2004 | Choi | ..................... | C07F 15/065 257/E21.438 |
| 2003/0211748 A1* | 11/2003 | Jin | .................... | H01L 21/31122 438/709 |
| 2004/0011380 A1* | 1/2004 | Ji | .............................. | B08B 7/00 134/1.1 |
| 2004/0110375 A1* | 6/2004 | Chen | ................. | H01L 21/28185 438/689 |
| 2004/0129674 A1* | 7/2004 | Bease | ............... | H01L 21/31111 216/67 |
| 2007/0072403 A1* | 3/2007 | Sakata | ............. | H01L 21/28518 438/585 |
| 2008/0265380 A1* | 10/2008 | Ragnarsson | ............ | C23C 16/56 257/632 |
| 2009/0258502 A1* | 10/2009 | Bae | ................... | H01L 21/31122 438/719 |
| 2010/0041236 A1* | 2/2010 | Lin | ................... | H01L 21/02071 438/704 |
| 2010/0099264 A1* | 4/2010 | Elers | ................. | H01L 21/31122 438/710 |
| 2011/0183527 A1* | 7/2011 | Cho | ........................ | C23C 16/18 438/785 |
| 2011/0212629 A1* | 9/2011 | Ivanov | ..................... | C09D 1/00 438/778 |
| 2012/0077322 A1* | 3/2012 | Hirota | ............... | H01L 21/02178 438/381 |
| 2013/0203267 A1* | 8/2013 | Pomarede | ......... | H01L 21/02148 438/778 |
| 2015/0279697 A1 | 10/2015 | Matsuda et al. | | |
| 2015/0299848 A1* | 10/2015 | Haukka | ................... | C23C 16/18 427/123 |
| 2016/0336175 A1* | 11/2016 | Hirose | ............... | H01L 21/02181 |
| 2017/0062205 A1* | 3/2017 | Chang | ................ | H01L 21/0228 |
| 2018/0166255 A1* | 6/2018 | Blomberg | ......... | H01J 37/32009 |
| 2019/0131120 A1* | 5/2019 | Yamaguchi | ....... | H01L 21/31116 |

* cited by examiner

FIG. 8

|  | REACTION RATE |
|---|---|
| SILICON OXIDE ($SiO_2$) | 0% |
| SILICON (Si) | 0% |
| TITANIUM NITRIDE (TiN) | 0% |
| SILICON NITRIDE (SiN) | 0% |
| STAINLESS STEEL (SUS304) | 0% |
| LANTHANUM OXIDE ($La_2O_3$) | 17% |

SEMICONDUCTOR MANUFACTURING APPARATUS FOR MANUFACTURING A SEMICONDUCTOR DEVICE HAVING A HIGH-K INSULATING FILM, AND A METHOD FOR MANUFACTURING THE SEMICONDUCTOR DEVICE

CLAIM OF PRIORITY

The present application claims priority from Japanese patent application JP 2017-085910 filed on Apr. 25, 2017, the content of which is hereby incorporated by reference into this application.

BACKGROUND OF THE INVENTION

1. Field of the Invention

The present invention relates to a semiconductor manufacturing apparatus for manufacturing a semiconductor device having a high-k insulating film, and a method for manufacturing the semiconductor device.

2. Description of the Related Art

The demands for miniaturization, higher speed and performance, and low power consumption of the state-of-the-art semiconductor devices continue to grow, and the use of a metal oxide film material having a specific dielectric constant higher than that of a silicon oxide ($SiO_2$) film or silicon oxynitride (SiON) film is getting increased as a gate insulating film becomes thinner. For example, studies are in progress for applying, to the gate insulating film, a high-k metal oxide film material, which include elements such as hafnium (Hf), zirconium (Zr), tantalum (Ta), titanium (Ti), yttrium (Y), lanthanum (La), and lanthanides as rare earth and include metal oxides hard to reduce at an interface with silicon (Si) at high temperature or composite oxides of these metals and silicon (Si).

However, it is not always easy to perform fine processing on these high-k insulating film materials. For example, it is known that the film quality deteriorates due to wet treatment of a fine processing process of a lanthanum oxide film ($La_2O_3$), in particular, a photolithography process. Various new technologies have been proposed for that problem. For example, JP 2009-252895 A discloses a technology for preventing a lanthanum film from deteriorating due to the wet treatment process by introducing a multilayer structure into the gate insulating film. In addition, JP 2015-191922 A discloses a technology of performing dry etching processing on a metal oxide including hard-to-etch materials by using a reactive ion etching method using gas including boron trichloride ($BCl_3$).

Steven George, Younghee Lee, Jaime DuMont, Nicholas Johnson and Amy Marquardt "Thermal Atomic Layer Etching Using Sequential, Self-Limiting Fluorination and Ligand-Exchange Reactions" (Proceedings of 38th International Symposium on Dry Process, Nov. 21-22, 2016, pp 15-16) as an approach different from the JP 2009-252895 A and JP 2015-191922 A discloses a technology of performing etching processing on an insulating film by fluorinating a surface of the insulating film material, converting the insulating film into a volatile organometallic complex by a ligand-exchange reaction between metal fluoride and an organic compound, and then evaporating and removing the volatile organometallic complex.

SUMMARY OF THE INVENTION

In the case of performing fine dimensional pattern processing in the wet treatment, there is a possibility that the pattern may collapse due to a surface tension of wet treatment liquid or rinse liquid. In contrast, in a reactive ion etching (RIE) technology using a gas including a halogen-based component such as $BCl_3$, since the dry etching is used, it is possible to avoid the problem of the pattern collapse, but since a vapor pressure of the halide of the metal element constituting the high-k insulating film material is low, it is not easy to secure a sufficient etching rate and there is also a need to improve an etching selective ratio with silicon (Si).

Since the method disclosed in Steven George, Younghee Lee, Jaime DuMont, Nicholas Johnson and Amy Marquardt "Thermal Atomic Layer Etching Using Sequential, Self-Limiting Fluorination and Ligand-Exchange Reactions" (Proceedings of 38th International Symposium on Dry Process, Nov. 21-22, 2016, pp 15-16) also uses the dry etching technology, it has been shown that it is possible to etch a hafnium oxide film ($HfO_2$) which is one of the high-k insulating film materials. Practically, however, a dry etching technology capable of etching the high-k insulating film material at a higher speed is required.

The inventor found thermal dry etching processing of converting a high-k insulating film into a volatile organometallic complex and then evaporating or subliming the volatile organometallic complex to be removed by studying etching chemistry of a gate insulating film material, and as a result, has reached the present invention. Since the dry etching is used, defects of the fine pattern collapse due to the wet treatment liquid do not occur, and since the volatile organometallic complex having a high vapor pressure is used, the etching can be performed at high speed.

A semiconductor manufacturing apparatus, including: a container in which a processing chamber is installed; a stage installed in the processing chamber and configured to hold a semiconductor substrate; a gas supply line configured to supply reactive gas to the processing chamber; and a vacuum line configured to exhaust the processing chamber, in which the semiconductor substrate includes a high-k insulating film, and as the reactive gas, mixed gas including complex-forming gas forming a volatile organometallic complex by reacting with a metal element included in the high-k insulating film and complex stabilizing material gas that increases stability of the organometallic complex is supplied.

Further, a second aspect of the invention is a method for manufacturing a semiconductor device, the method including: placing, in a processing chamber, a semiconductor substrate on which a mask layer having a predetermined pattern shape is formed on a high-k insulating film; desorbing gas or a foreign matter adsorbed on a surface of the semiconductor substrate; supplying reactive gas to the processing chamber in a state where a temperature of the semiconductor substrate falls below a predetermined temperature; stopping the supply of the reactive gas and heating the semiconductor substrate; and vaporizing an organometallic complex generated by reacting with a metal element included in the high-k insulating film and exhausting the vaporized organometallic complex from the processing chamber, wherein the reactive gas is mixed gas including complex-forming gas forming the organometallic complex by reacting with the metal element included in the high-k insulating film and complex stabilizing material gas that increases stability of the organometallic complex.

It is possible to selectively etch the high-k insulating film at high speed.

BRIEF DESCRIPTION OF THE DRAWINGS

FIG. 8 is a diagram illustrating a reaction rate of mixed etching gas and a substance.

DESCRIPTION OF THE PREFERRED EMBODIMENTS

Figure 1:
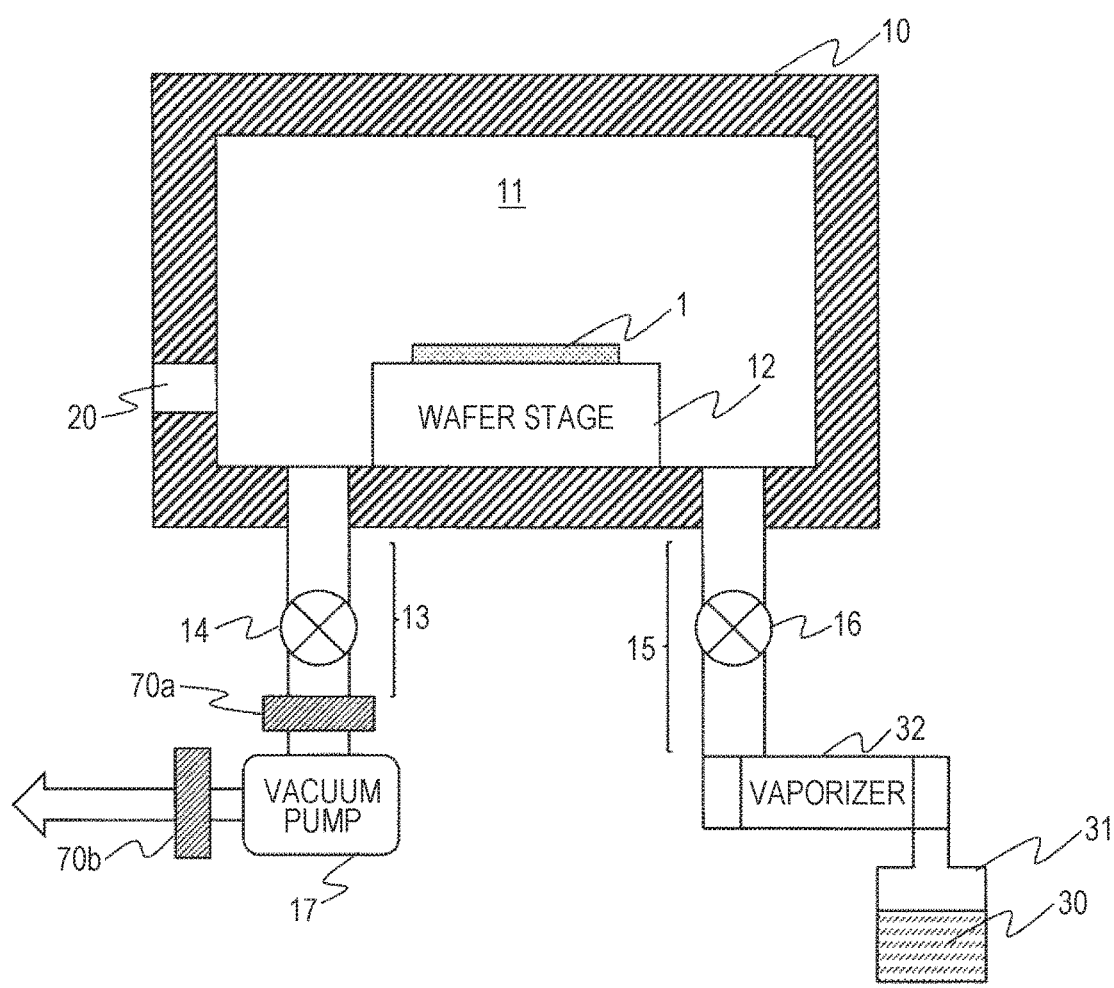
FIG. 1 is a schematic diagram of a semiconductor manufacturing apparatus (processing portion)

FIG. 1 illustrates a semiconductor manufacturing apparatus (processing portion) of the present embodiment. The semiconductor manufacturing apparatus includes a container 10 configuring a vacuum chamber, in which a processing chamber 11 is installed in the container 10 and a wafer stage 12 for holding a semiconductor substrate (wafer) 1 is installed in the processing chamber 11. A vacuum line 13 and a gas supply line 15 are connected to the container 10, and the vacuum line 13 and the gas supply line 15 are each provided with an opening/closing valve 14 and an opening/closing valve 16. By this configuration, an internal pressure of the processing chamber 11 can be controlled by controlling and adjusting a vacuum system and a gas supply system. Further, the semiconductor substrate 1 outside the processing chamber 11 is conveyed into the processing chamber 11 or the semiconductor substrate 1 inside the processing chamber 11 is conveyed out of the processing chamber 11, through a wafer conveyance port 20 installed in the container 10.

Although not illustrated, a heater for heating or a heating unit such as a halogen lamp and a cooling unit such as a chiller pipe for cooling are installed in the semiconductor manufacturing apparatus, and temperatures of the container 10, the processing chamber 11, and the wafer stage 12 are adjusted such that a surface temperature of the semiconductor substrate 1 falls within a proper range. Similarly, various functional units or various sensors used for manufacturing a semiconductor device, for example, a plasma generation source, an external network connection device, an uninterruptible power supply, a pressure gauge, a thermometer, a flow meter or the like are installed as necessary.

In the semiconductor manufacturing apparatus, a wafer chucking mechanism for certainly grasping the wafer which is being etched is installed in the wafer stage 12. According to the present embodiment, an electrostatic chuck for electrostatically chucking the wafer can be applied. In the case of an electrostatic adsorption method, a density distribution of plasma generated in the processing chamber may be affected by an electric field generated near a wafer surface. Although the etching principle of the present embodiment will be described later, unlike an RIE method, ion species and radical species in the plasma are not used for processing an insulating film, and the generation of the plasma is limited to, for example, a pretreatment process such as removal of adsorbed gas on the surface. For this reason, there is no risk of affecting processing accuracy of the insulating film even if the electrostatic chuck is applied. Any of a coulombs force type, a gradient force type, and a Johnsen-Rahbek type is selectively applied according to a kind and a content of a material to be etched and etching processing. It may be other chucking mechanisms such as a mechanical chuck.

A chemical liquid tank 31 for storing a chemical liquid 30 as a raw material of etching gas and a vaporizer 32 for vaporizing the chemical liquid 30 are connected to the gas supply line 15. The chemical liquid 30 is a mixed raw material liquid for generating mixed etching gas including complex-forming gas which is a component for converting a high-k insulating film formed on the wafer 1 into a volatile organometallic complex and complex stabilizing material gas which is a component for increasing stability of the volatile organometallic complex. The chemical liquid 30 is sent to the vaporizer 32 to generate reactive gas (hereinafter referred to as mixed etching gas) including a mixture of the above-described plurality of functional gas components. The chemical liquid 30 at least includes a raw material for the complex-forming gas and a raw material for the complex stabilizing material gas.

In the present embodiment, the mixed chemical liquid 30 mixed with the kind of raw material gases is introduced into the single vaporizer 32, and plural components are simultaneously gasified to generate the mixed etching gas and are introduced into the processing chamber 11 through the single gas supply line 15. The reason will be described later. As the structure of the vaporizer 32, for example, a bubbling type can be applied. By using a vaporizer having a simple structure, it is possible to reduce the cost of the semiconductor manufacturing apparatus and minimize the installation area. In addition to the bubbling type, a known vaporizer such as a direct injection type, an ultrasonic atomization method, or a combination thereof can be used.

Figure 2:
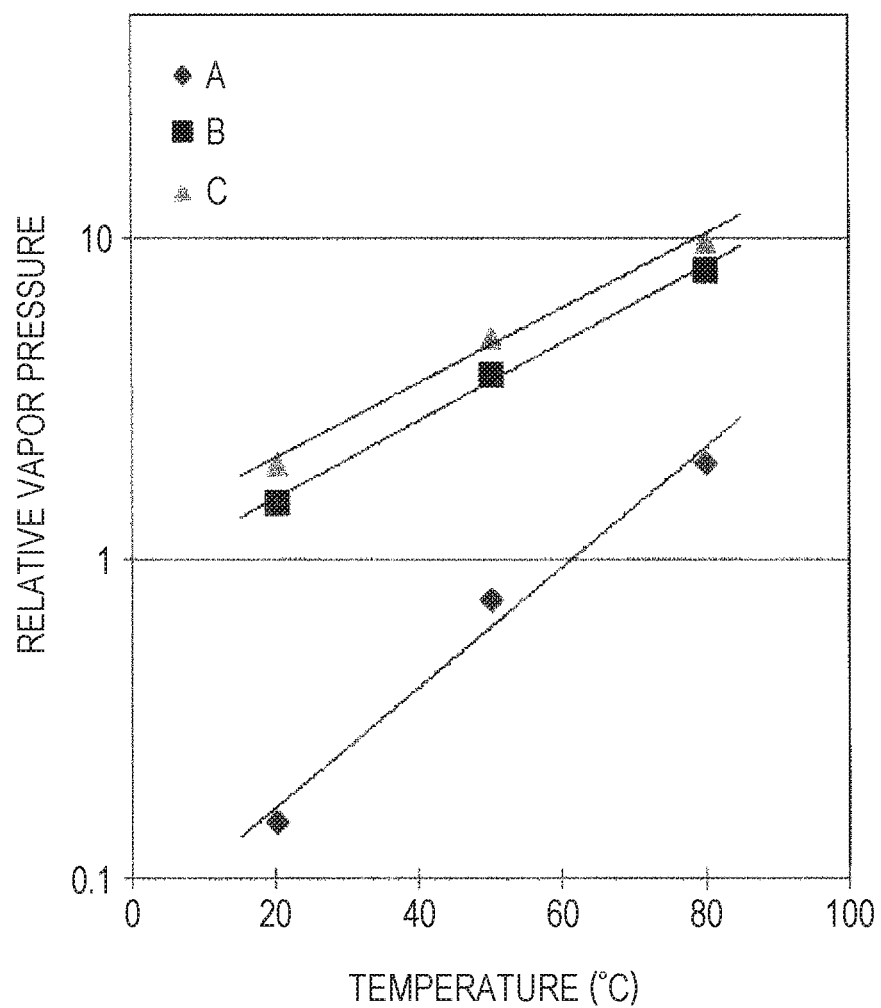
FIG. 2 is a diagram for describing an operation principle of a vaporizer.

By appropriately selecting the combination of the complex-forming gas and the complex stabilizing material gas and the operating condition of the vaporizer 32, the supply of the mixed etching gas can be realized by the gas supply line 15 having a simple structure. The operation principle of the unified vaporizer 32 will be described with reference to FIG. 2. In FIG. 2, a horizontal axis represents temperature (° C.), a vertical axis represents a relative vapor pressure (represented by logarithm), and a raw material a of gas A, a raw material b of gas B, and a raw material c of gas C each represent a relative vapor pressure at each temperature. In addition, the gas A and the gas C are complex-forming gas, and the gas B is complex stabilizing material gas. Referring to FIG. 2, it is read that a ratio of a relative vapor pressure of the liquid raw material a of the gas A and a relative vapor pressure of the liquid raw material b of the gas B is 1:13 at 20° C., 1:5 at 50° C., and 1:4 at 80° C. That is, the mixing ratio of the gas A and the gas B included in the mixed gas generated from the vaporizer 32 can be adjusted to a range of 1:13 to 1:4 by filling the vaporizer 32 with the mixed liquid of the liquid raw material a and the liquid raw material b and adjusting an operating temperature of the vaporizer 32 to be between 20 to 80° C. In addition, instead of the gas A, if the chemical liquid 30 including a mixture of the liquid raw material c of the gas C exhibiting characteristics similar to those of the gas A and the liquid raw material b is used, it is understood that the mixed etching gas in which a mixing ratio of the gas C and the gas B is 5:4 under, for example, the operating condition at 80° C. can be prepared. Even when the chemical liquid 30 includes three or more kinds of components as a raw material, it is possible to control the respective mixing ratios by the same method.

Based on the principle, by selecting the combination of the gasification raw material kinds and the operating condition of the vaporizer, the mixed etching gas having a predetermined mixing ratio and predetermined characteristics can be obtained even by the gas supply line 15 having a simple structure. It should be noted that not only the temperature control but also the pressure control or the combination of the pressure control and the temperature control can be used as the operating condition of the vaporizer.

In addition, it is possible to not only use the mixed liquid of the plurality of raw materials as the chemical liquid 30, but also use as the chemical liquid 30 an etching gas precursor substance in which a partial structure (function expressing partial structure) corresponding to the raw material for the complex-forming gas and a partial structure (function expressing partial structure) corresponding to the raw material for the complex stabilizing material gas are bonded to the respective places of the same molecule. By vaporizing the etching gas precursor substance with the vaporizer, the complex-forming gas and the complex stabilizing material gas are synchronously released from the etching gas precursor substance to obtain the mixed etching gas including the complex-forming gas and the complex stabilizing material gas. When the etching gas precursor substance is used, it is possible to accurately control the mixing ratio of the complex-forming gas and the complex stabilizing material gas to be generated by a chemical structure of the precursor. In general, since the vapor pressure is reduced when a molecular weight of a material is increased, it is preferable that the molecular weight of the precursor substance is small.

Figure 3:
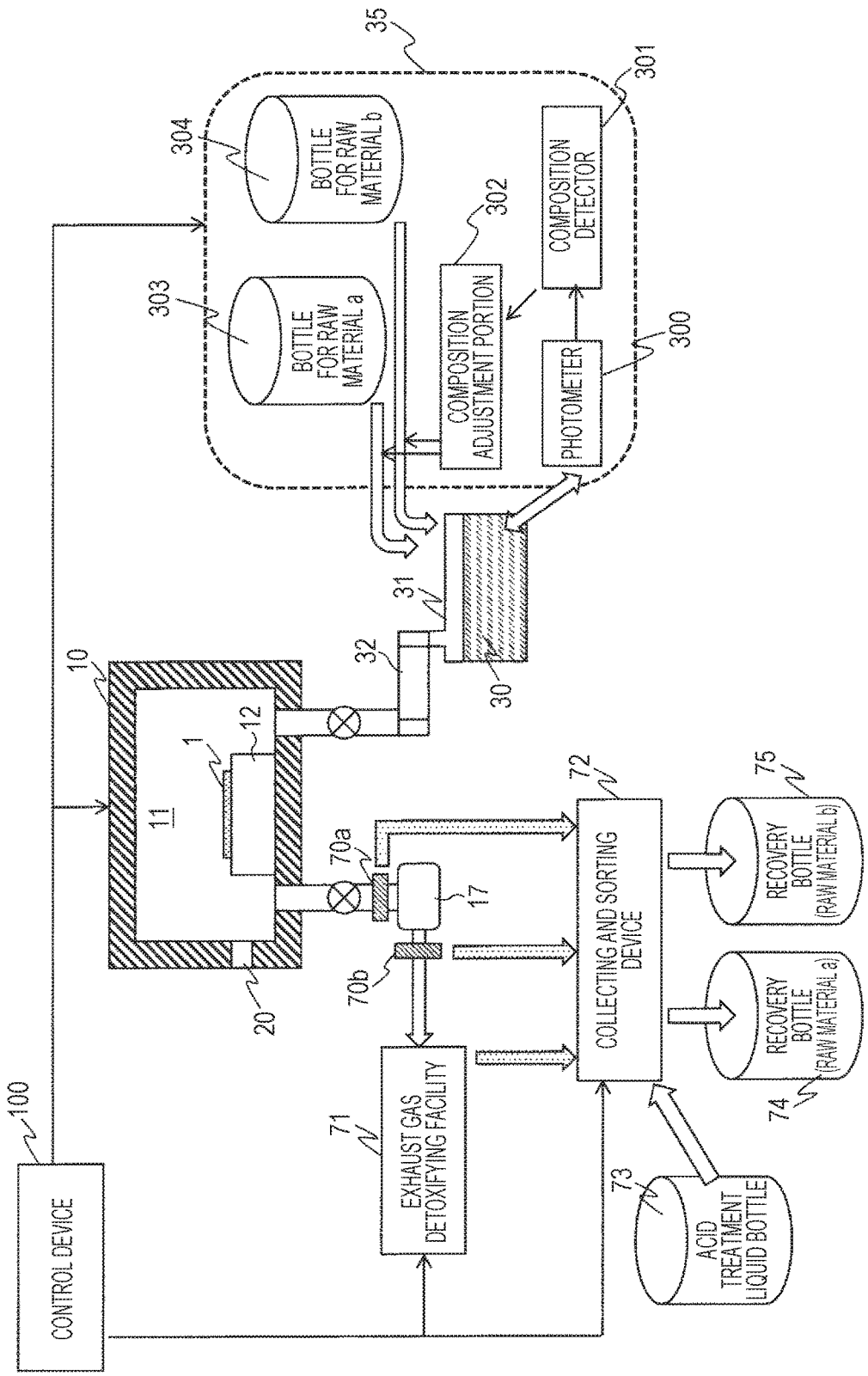
FIG. 3 is a schematic diagram of the semiconductor manufacturing apparatus (including peripheral units).

When the mixed chemical liquid 30 is used, it is preferable to include a mixed chemical liquid composition adjustment unit 35 that continuously monitors the composition of the mixed chemical liquid 30 filled in the chemical liquid tank 31 and adjusts the composition according to the obtained monitoring result. FIG. 3 illustrates the semiconductor manufacturing apparatus including the peripheral units of the processing portion in addition to the processing portion illustrated in FIG. 1. In order to continuously monitor the composition of the mixed chemical liquid 30, various kinds of non-destructive chemical liquid concentration meters can be applied, and an infrared absorptiometer 300 is preferably used. A case in which a mixed liquid of the liquid raw material a of the gas A and the liquid raw material b of the gas B is used as the mixed chemical liquid 30 is described by way of example. An infrared absorption spectroscopy is performed on several types of mixed liquids having different mixture ratios of the liquid raw material a of the gas A and the liquid raw material b of the gas B in advance, a calibration curve is prepared in advance based on absorbency of at least two kinds of wavelengths, which is stored in a composition detector 301. The composition detector 301 compares the measurement result of infrared absorption intensity of the mixed chemical liquid 30 by the infrared absorptiometer 300 with the calibration curve to obtain the composition ratio of the liquid raw material a of the gas A and the liquid raw material b of the gas B included in the mixed chemical liquid 30. Specifically, a case in which the liquid raw material a is a chemical substance having a carbonyl group in a molecule and the liquid raw material b is a chemical substance that does not have the carbonyl group but has an ether group in a molecule will be described below. In this case, by the infrared spectroscopy, an infrared absorption peak showing stretching vibration of the carbonyl group appears in an area near $1700 \pm 50$ $cm^{-1}$, an infrared absorption peak showing stretching vibration of the ether group appears in an area near 1000 to 1300 $cm^{-1}$, and the two infrared absorption peaks do not overlap each other and their peak intensity is changed according to the included concentration. Therefore, by performing the infrared absorption intensity spectroscopy on the mixed chemical liquid 30, the peak intensity appearing in the area near $1700 \pm 50$ $cm^{-1}$ and the peak intensity appearing in the area near 1000 to 1300 $cm^{-1}$ each reflect the concentration of the mixed chemical liquid 30 of the liquid raw material a having the carbonyl group and the concentration of the mixed chemical liquid 30 of the liquid raw material b having the ether group. The same goes for the case of a mixed liquid of three or more kinds of materials.

In accordance with the result obtained by the composition detector 301 monitoring the composition of the mixed chemical liquid 30, a composition adjustment portion 302 performs adjustment of the composition of the chemical liquid 30 remaining in the chemical liquid tank 31, that is, an operation such as replenishment of deficient components from a bottle 303 for the liquid raw material a and/or a bottle 304 for the liquid raw material b.

It should be noted that in addition to an infrared spectrophotometer illustrated in FIG. 3, a simple analyzer of a specific gravity, a refractive index or the like may be installed in the chemical liquid tank 31 to simply monitor the composition. In addition, if impurities or foreign matters are mixed in the mixed chemical liquid 30, there is a possibility that the impurities or foreign matters are infiltrated into the processing chamber 11 via the vaporizer 32 and the gas supply line 15. Therefore, the mixing of impurities or foreign matters into the mixed chemical liquid 30 should be avoided. In particular, when water ($H_2O$) is mixed in the mixed chemical liquid 30, since there is a possibility that remarkable deterioration of the etching performance of the mixed etching gas may occur, it is preferable for the composition detector 301 to strictly monitor the amount of moisture mixed in the mixed chemical liquid 30.

Although not illustrated, a carrier gas supply system for adjusting a supply concentration of the mixed etching gas in addition to a system for supplying the mixed etching gas is also connected to the gas supply line 15, and if necessary, the concentration of the mixed etching gas supplied into the processing chamber 11 can be adjusted within a range of 0 to 100%. As the carrier gas, general inert gas such as nitrogen or argon may be used.

In addition, vaporizers of a plurality of systems may be connected to the gas supply line 15 in consideration of the complication of the structure of the semiconductor device to be manufactured and the diversification of the high-k insulating film material to be etched. Furthermore, in the case where the vaporizers of the plurality of systems are installed, the chemical liquid 30 filled in each of the chemical liquid tanks 31 may be the mixed chemical liquid of the plurality of liquid raw materials or a single chemical stock solution.

(1) It is possible to easily adjust the mixing ratio of the mixed etching gas by vaporizing the single chemical stock solution in each of the vaporizers or the vaporizer of at least one system of the plurality of systems. In addition, in the above example, in the case in which first mixed etching gas of the gas A and the gas B is generated from a vaporizer of a first system, etching gas of the gas C is generated from a vaporizer of a second system, the first mixed etching gas reacts on a first high-k insulating film material, and second mixed etching gas in which the gas C is additionally mixed with the first mixed etching gas reacts on a second high-k insulating film material (which differs from the first high-k insulating film material in terms of rare earth elements included), the vaporizer of the first system is used when the first high-k insulating film layer of the semiconductor device is etched and the vaporizers of the first system and the second system are used together when the second high-k insulating film layer is etched, such that it is possible to easily etch different high-k insulating film layers having a plurality of materials included in the semiconductor device.

(2) In the case in which the mixed chemical liquid is vaporized by each of the vaporizers of the plurality of systems, in the above example, for example, the vaporizer of the first system can generate the first mixed etching gas of the gas A and the gas B and the vaporizer of the second system can generate third mixed etching gas of the gas C and the gas B. In this case, if both the first mixed etching gas and the third mixed etching gas react on the same high-k insulating film material, it is considered that the vaporizers of the first system and the second system are used together to etch the predetermined high-k insulating film layer of the semiconductor device. In addition, when the first mixed etching gas reacts on the first high-k insulating film material and the third mixed etching gas reacts on the second high-k insulating film material (which differs from the first high-k insulating film material in terms of rare earth elements included), the vaporizer of the first system is used when the first high-k insulating film layer of the semiconductor device is etched and the vaporizer of the second system is switched and used when the second high-k insulating film layer is etched, such that it is possible to easily etch different high-k insulating film layers having the plurality of materials included in the semiconductor device.

The vacuum line 13 is provided with a cold trap 70 to prevent the mixed etching gas discharged as unreacted or a compound (volatile organometallic complex) generated by the etching processing from leaking to the environment. The cold trap 70 is installed between the container 10 and the opening/closing valve 14, between the opening/closing valve 14 and the vacuum pump 17, and at one or more place in an exhaust system of the vacuum pump 17 to cool and condense the unreacted etching gas discharged together with the carrier gas from the processing chamber 11 or the compound (volatile organometallic complex) generated by the etching processing. FIGS. 1 and 3 illustrate an example in which a first cold trap 70a is installed between the opening/closing valve 14 and the vacuum pump 17 and a second cold trap 70b is installed in the exhaust system of the vacuum pump 17. The exhaust system of the vacuum pump 17 is finally connected to an exhaust gas detoxifying facility 71 and extra etching gas, volatile organometallic complex or the like which cannot be cold-condensed by the cold trap 70 are adsorbed and collected by an adsorbent to be removed. FIG. 3 illustrates the arrangement example in which the cold trap 70b and the exhaust gas detoxifying facility 71 are connected to the exhaust system of the vacuum pump 17 in series, but it is not limited to the arrangement example.

In order to beneficially utilize the chemical substances cold-condensed by the cold trap 70 and/or the exhaust gas detoxifying facility 71, a collecting and sorting device 72 decomposes the collected chemical substances as they are or as needed to collect and sort valuable substances. Specifically, the mixed etching gas discharged as unreacted or the compound (volatile organometallic complex and the like) generated by the etching processing is mixed and reacted with an acid treatment liquid supplied from an acid treatment liquid bottle 73 in the collecting and sorting device 72. By reacting the chemical substances cold-condensed by the cold trap 70 and the exhaust gas detoxifying facility 71 with the acid treatment liquid under appropriate conditions, some of the chemical substances are acid-decomposed, and the liquid raw material a and the liquid raw material b included in the mixed chemical liquid 30 can be separated and regenerated from the acid-decomposed chemical substances. The separated and regenerated liquid raw materials a and b are collected to recovery bottles 74 and 75, respectively.

The acid treatment liquid used in the collecting and sorting device 72 is a liquid obtained by dissolving a substantially nonvolatile acidic substance in a non-aqueous polar solvent having a boiling point >200° C. The acidic substance preferably is a substance having an acid dissociation constant pKa of 3 or less as an index representing acidity of the acidic substance (acidity is stronger as the pKa value is smaller). It is determined whether or not the mixed etching gas or the compound recovered by the acid treatment liquid can be acid-decomposed based on the raw material. Although the raw material suitable for the present embodiment is described below, these raw materials can be acid-decomposed if the pKa of the acidic substance is equal to or less than 3. By contrast, it is also possible to use an acidic substance having a lower acidity corresponding to the raw material if the acidic substance is selected according to the used raw material.

The collecting and sorting device 72 acid-decomposes the mixed etching gas or the volatile organometallic complex generated by the etching processing and the like, regenerates the raw material for the complex-forming gas and the raw material for the complex stabilizing material gas, and recovers the raw material in a form of a solution dissolved in the non-aqueous solvent. Further, a distillation device including a fractionator performs a distillation operation on the solution of the non-aqueous solvent including the raw material for the complex-forming gas and the raw material for the complex stabilizing material gas as a solute to fractionally distill the raw material for the complex-forming gas and the raw material for the complex stabilizing material gas. In order to simply perform the fractional distillation as possible, a substance having a low boiling point is not used as the non-aqueous solvent or the acidic substance. In addition, if acetic acid, hydrochloric acid or the like which is a volatile acidic substance is used, there is a possibility that the separation is insufficient in a relatively simple fractionating device, for example, a fractionating device having the theoretical plate number of 20 plates or less. In this manner, in the case of using the low boiling point non-aqueous solvent or the low boiling point acidic substance, the raw material for the complex-forming gas and the raw material for the complex stabilizing material gas are insufficiently separated from the non-aqueous solvent or the acidic substance only by the fractional distillation, such that it is difficult to reuse the raw materials as they are or there are some restrictions in reusing the raw materials. In addition, if an aqueous solvent, alcohol or the like is used instead of the non-aqueous solvent, the regenerated raw material for the complex-forming gas and the raw material for the complex stabilizing material gas react with the aqueous solvent, the alcohol or the like, and therefore there is a possibility that the collected amount is decreased. For this reason, it is preferable to use the non-aqueous solvent as the solvent of the acid treatment liquid.

Specific examples of the non-aqueous polar solvent having a boiling point of higher than 200° C. may include tetramethylene sulfone (sulfolane), dimethylimidazolidinone, triglyme and the like. In addition, specific examples of the acidic substance having pKa<3 may include toluenesulfonic acid, methanesulfonic acid, phosphoric acid and the like. In contrast, there is a problem in that a fractionating distillation of volatile acids such as hydrochloric acid, nitric acid and formic acid becomes complicated as described above.

In order to recover and reuse the raw material, it is preferable to recover the chemical substances without impurities. From this viewpoint, when there is a possibility that impurities derived from the vacuum pump are mixed into the exhaust system of the vacuum pump 17, only chemical substances cold-condensed by the cold trap 70a installed in front of the vacuum pump 17 may be a recovery target of a raw material, and others may be discarded. In addition, the cold trap 70a is disposed in front of the vacuum pump 17 to prevent the chemical substances from being mixed into the vacuum pump 17. When the chemical substances cold-condensed by the cold trap 70b installed in the exhaust system of the vacuum pump 17 or the exhaust gas detoxifying facility 71 are discarded, it is allowable to use the aqueous solvent or the alcohol instead of the non-aqueous solvent.

Next, a description will be given of a semiconductor manufacturing method performed by the semiconductor manufacturing apparatus in FIG. 1 or 3. The processing in the semiconductor manufacturing apparatus is controlled by a control device 100.

Figure 4:
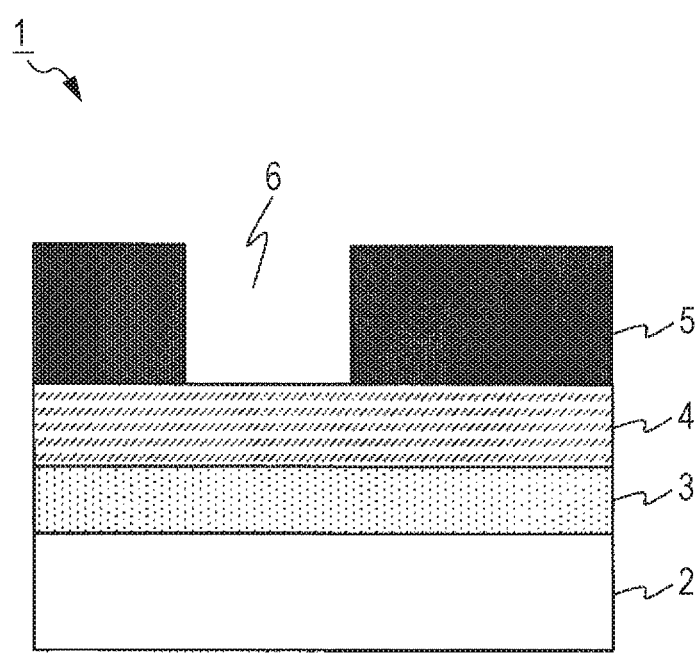
FIG. 4 is an example of a cross-sectional view of a semiconductor substrate.
Figure 5:
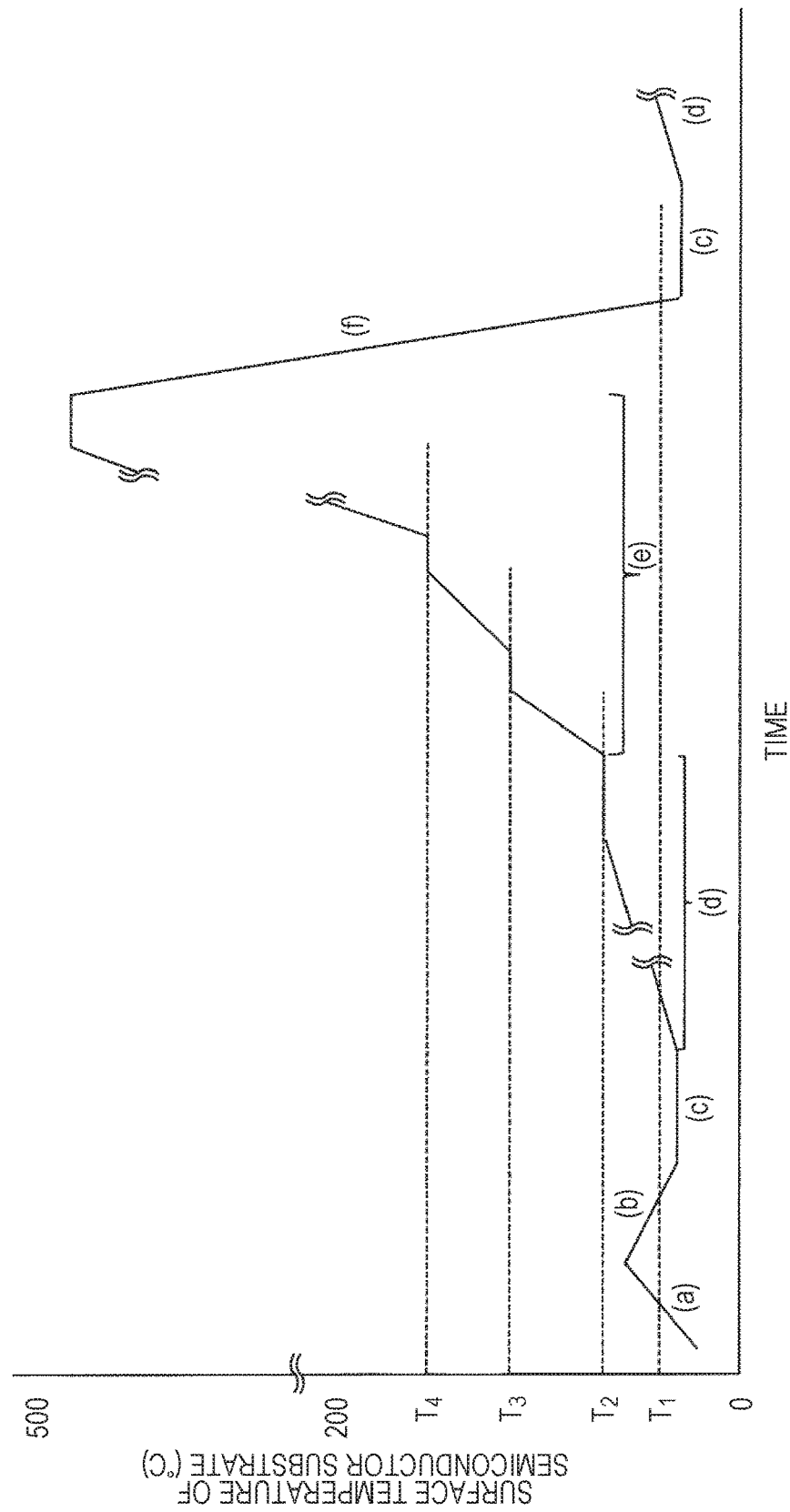
FIG. 5 is a diagram schematically illustrating an example of a surface temperature cycle of the semiconductor substrate in an etching process.

First, a wafer conveyance device (not illustrated) conveys the semiconductor substrate (wafer) 1 into a desired position on the wafer stage 12 disposed in the processing chamber 11 through the wafer conveyance port 20 installed in the container 10. The conveyed semiconductor substrate 1 is adsorbed and fixed by a gripping force of the wafer stage 12. The high-k insulating film and a resist film or a hard mask film having an opening pattern at a desired place are formed on the semiconductor substrate 1 in advance. FIG. 4 illustrates an example of a cross-sectional view of the semiconductor substrate (wafer) 1. A high-k insulating film 4 is formed on a silicon oxide ($SiO_2$) film 3 formed on a silicon (Si) substrate 2, and a hard mask 5 having a desired gate electrode pattern shape is further formed on the high-k insulating film 4. The high-k insulating film 4 is, for example, a lanthanum oxide ($La_2O_3$) film or a hafnium oxide ($HfO_2$) film. First, after the lanthanum oxide ($La_2O_3$) film or the hafnium oxide ($HfO_2$) film is formed by the known sputtering method, physical vapor deposition (PVD) method, atomic layer deposition (ALD) method, chemical vapor deposition (CVD) method and the like, heat treatment of about 500 to 1000° C. is performed to obtain a desired film quality. To process the lanthanum oxide film or the hafnium oxide film to have a desired gate electrode pattern shape, the hard mask film 5 and a photoresist film are sequentially formed on the formed high-k insulating film 4, a desired pattern is transferred to the photoresist film using a photolithography technology, and the hard mask 5 is processed using the resist pattern as a mask to expose a part of the high-k insulating film 4. FIG. 4 illustrates a state in which the remaining resist pattern is removed thereafter. It should be noted that a semiconductor layer formed on the semiconductor substrate (wafer) 1 is not limited to the example of FIG. 4. For example, an insulating layer formed under the high-k insulating film 4 may be a silicon nitride (SiN) film. The semiconductor manufacturing apparatus of the present embodiment removes an exposed part 6 by selective etching. In this selective etching, a non-plasma-like dry etching technology as described below is applied. FIG. 5 schematically illustrates a surface temperature cycle of the semiconductor substrate in the etching process of the present embodiment. It should be noted that FIG. 5 is illustrated to easily understand points of temperature control in the etching process of the present embodiment, in which an actually generated temperature, a temperature gradient, or a necessary control time becomes different depending on a kind of material to be etched, a kind of complex-forming material, a structure of a semiconductor device and the like.

After the semiconductor substrate 1 is fixed on the wafer stage 12, the insides of the container 10 and the processing chamber 11 are decompressed, the semiconductor substrate 1 is heated while being decompressed, and gases (water vapor and the like) or foreign matters adsorbed on the surface of the semiconductor substrate 1 are desorbed (period (a)). After it is confirmed that the desorption of the gas component adsorbed on the surface of the semiconductor substrate 1 is almost completed based on a display by an indication of a pressure gauge installed in the container 10 or the processing chamber 11, the heating of the semiconductor substrate 1 is stopped while the semiconductor substrate 1 being decompressed and cooling is started (period (b)). Any known means can be used for the heating/cooling. However, since processing of temperature rising or heat releasing (temperature falling) as described below is performed plural times, a heating/cooling mechanism suitable for rapid heating or rapid cooling is preferable. For example, it is preferable to control the surface temperature of the semiconductor substrate 1 to rapidly reach a desired temperature by combining a lamp type heating mechanism such as a halogen lamp or a xenon lamp and a pusher pin mechanism lifting up the semiconductor substrate 1 from the wafer stage 12. It should be noted that when the lamp type heating is performed, there is a need to select a wavelength of a lamp type heating light source by evaluating a behavior of the organometallic complex generated during the etching with respect to light. In other words, the organometallic complex generated by the reaction of the high-k insulating film 4 with the complex-forming gas and the complex stabilizing material gas may be decomposed by light irradiation. For this reason, it is necessary to select the irradiation wavelength by evaluating a decomposition resistance of the organometallic complex against light in advance. Since the organometallic complex generated by the reaction of the high-k insulating film with the complex-forming gas and the complex stabilizing material gas shows a light absorption behavior peculiar to the organometallic complex called metal to ligand charge transfer spectrum, there is a need to prevent light near the wavelength band from being irradiated. Meanwhile, since the organometallic complex also has property of efficiently absorbing light of a specific wavelength band and converting the light into heat, rapid heating can be performed by using a light source emitting light of the wavelength band. In general, since the metal to ligand charge transfer spectrum is often in a wavelength band of 350 nm or less, it is preferable to block the light in the wavelength band of 350 nm or less when the lamp type heating is performed. Meanwhile, generally, the organometallic complex has a high absorption efficiency of infrared light in a range of 2 to 10 μm. Therefore, for example, a halogen lamp installed with a yellow-cut-filter in order not to emit light including so-called ultraviolet light of 400 nm or less is used as a light source.

It should be noted that since the heating in the period (a) is to desorb the gases or foreign matters adsorbed on the surface, it is also possible to apply the known methods other than the heating. In addition, these methods may be used together with the heating processing.

The temperature of the semiconductor substrate 1 is lowered until it falls below temperature $T_1$ (hereinafter, referred to as a gas introduction upper limit temperature $T_1$). Thereafter, the mixed etching gas is introduced into the processing chamber 11 together with the carrier gas through the gas supply line 15 to be in contact with the surface of the semiconductor substrate 1, and the molecules of the complex-forming gas or the molecules of the complex stabilizing material gas included in the mixed etching gas are physically adsorbed on the surface of the semiconductor substrate 1 (period (c)).

Here, if the mixed etching gas is introduced into the processing chamber 11 in a state where the temperature of the semiconductor substrate 1 exceeds a predetermined gas introduction upper limit temperature $T_1$, the reaction of the high-k insulating film 4, for example, the lanthanum oxide film with the mixed etching gas partially proceeds quickly. Therefore, the etching performed in a lateral direction from the hem of the resist pattern, a so-called side etching, is performed, or defects such as susceptibility to influence of concentration irregularity of the mixed etching gas or strong revelation of a micro loading effect tend to occur. Further, the mixed etching gas reacts with a material other than the high-k insulating film 4, for example, a resist material or another metal film, silicon of the semiconductor substrate 1, or silicon oxide or the like, such that there is a possibility that the desired processed shape and desired characteristics cannot be obtained. To minimize the occurrence of the defects, the mixed etching gas is introduced into the processing chamber 11 after waiting until the temperature of the semiconductor substrate 1 falls below the predetermined gas introduction upper limit temperature $T_1$.

The upper limit of the temperature at which the mixed etching gas is introduced into the processing chamber 11 is influenced by various factors such as the dimension of the wafer 1, the material of the wafer, the film structure/film composition of the high-k insulating film, the composition of the mixed etching gas, and the film thickness or the opening dimension of the resist film or the hard mask film. For this reason, there is a need to check and set the gas introduction upper limit temperature $T_1$ beforehand for each semiconductor device to be processed.

After the temperature of the semiconductor substrate 1 in a state where the mixed etching gas is physically adsorbed on the surface of the high-k insulating film slowly rises by slow heating while being maintained not to exceed 200° C. even at the place where the temperature is highest in the semiconductor substrate 1 and then is maintained at a predetermined temperature $T_2$ for a certain time (period (d)), the rapid temperature rising to the highest temperature of 500° C. is performed while only the carrier gas (mixed etching gas concentration is zero) is supplied through the gas supply line 15 (period (e)). In the meantime, a balance between a supply rate of the mixed carrier gas supplied through the gas supply line 15 and an exhaust rate of the carrier gas exhausted through the vacuum line 13 is adjusted to maintain an appropriately decompressed state.

The molecules of the complex-forming gas and the molecules of the complex stabilizing material gas which are the components of the mixed etching gas are hopping diffused while being physically adsorbed on the surface of the semiconductor substrate 1 during the slow heating, such that the adsorption density (adsorption amount per unit surface area) on the surface of the semiconductor substrate 1 is uniform. In the period (d), to prevent the transition from the physical adsorption state to the chemical adsorption state before the adsorption density of the molecules of the complex-forming gas and the molecules of the complex stabilizing material gas on the substrate surface reaches the uniform state, there is a need to control the processing conditions such as the temperature, the time, and the pressure and the optimization of the processing conditions for each semiconductor device to be manufactured is performed.

It should be noted that since the purpose of setting the period (d) is to uniformize the density at which the molecules of the complex-forming gas and the molecules of the complex stabilizing material gas are adsorbed on the surface of the semiconductor substrate 1, the period (d) may be unnecessary as long as the sufficient uniformity of processing accuracy can be realized in the period (period (c)) in which the mixed etching gas is introduced. Alternatively, only the slow heating may be performed.

After the in-plane uniformity of the adsorption density is achieved by the slow heating, the rapid heating and temperature rising are performed while only the carrier gas in which the concentration of the mixed etching gas is zero is supplied (period (e)). In the earliest stage of the rapid heating and temperature rising, the chemical reaction is generated between the molecules of the complex-forming gas and the molecules of the complex stabilizing material gas included in the etching gas and the outermost molecular layer of the high-k insulating film 4 of the semiconductor substrate 1. The material of the high-k insulating film 4 is selected so as to conform to specifications and characteristics of the device to be manufactured, and is, for example, an oxide film including metal elements classified in a fifth period such as Y, Zr, La, Hf, and Ta and the following periods of the periodic table of elements. In the chemical reaction, the molecules of the complex-forming gas and the molecules of the complex stabilizing material gas react with the high-k insulating film 4 to be converted into the molecules of the volatile organometallic complex including the metal elements included in the high-k insulating film 4. The reaction of the metal elements included in the high-k insulating film with the molecules of the complex-forming gas and the molecules of the complex stabilizing material gas adsorbed on the high-k insulating film 4 in the physically adsorbed state proceeds at an interface therebetween, and one layer on the outermost surface of the high-k insulating film 4 is converted into the organometallic complex. If one layer on the outermost surface of the high-k insulating film 4 is converted into the organometallic complex, the generated organometallic complex prevents the direct contact of the molecules of the complex-forming gas and the high-k insulating film 4 to suppress the reaction to increase the film thickness due to the additional generation of the organometallic complex. Therefore, if the film thickness of the organometallic complex reaches the film thickness corresponding to the film thickness generated by converting one layer of the outermost surface of the high-k insulating film 4 into the organometallic complex, the reaction to convert the high-k insulating film 4 into the organometallic complex is substantially stopped.

After the outermost surface layer of the high-k insulating film 4 is converted into the organometallic complex in the earliest stage of the rapid heating and temperature rising, if the temperature of the semiconductor substrate 1 further rises to reach near the boiling points of each of the complex-forming gas and the complex stabilizing material gas which are the components of the mixed etching gas, the molecules of the complex-forming gas and the molecules of the complex stabilizing material gas which are physically adsorbed on the surface of the semiconductor substrate 1 cannot maintain the physically adsorbed state to start to be desorbed from the surface of the semiconductor substrate 1 and are swept away by the carrier gas flow to be removed from the surface of the semiconductor substrate 1. While the removal of the complex-forming gas and the complex stabilizing material gas which are in the physically adsorbed state is progressed, since the latent heat of vaporization of the complex-forming gas and the complex stabilizing material gas is deprived, the surface temperature of the semiconductor substrate 1 does not rise (temperatures $T_3$ and $T_4$). Since the organometallic complex has a boiling point higher than that of the complex-forming gas and the complex stabilizing material gas, the organometallic complex is not desorbed at this point.

When the molecules of the complex-forming gas and the molecules of the complex stabilizing material gas which are in the physically adsorbed state on the surface of the semiconductor substrate 1 are completely removed, the surface temperature of the semiconductor substrate 1 rapidly rises, but if the temperature reaches near a volatilization point (boiling point or sublimation point) of the organometallic complex, the molecules of the organometallic complex starts to be desorbed from the high-k insulating film 4 on the surface of the semiconductor substrate 1. At this time, since the components derived from the complex stabilizing material gas are included in the molecules of the organometallic complex, the organometallic complex is desorbed/volatilized from the surface of the high-k insulating film 4 without being decomposed and is swept away by the carrier gas flow to be removed from the surface of the semiconductor substrate 1. In the example of FIG. 5, in order to completely remove the organometallic complex converted from the high-k insulating film 4, the temperature rapidly rises to the highest attainment temperature of 500° C., but it is preferable to appropriately adjust the highest attainment temperature according to the kind of high-k insulating film and the composition of the organometallic complex converted therefrom. It should be noted that since the change in temperature at the time of the desorption of the organometallic complex is determined by the balance between heat generation by a chemical bond cleaving reaction and the absorption by the latent heat of evaporation, it does not mean that the temperature rises simply as illustrated in FIG. 5.

By this series of processes, after the outermost surface layer of the high-k insulating film 4 is converted into the organometallic complex, the organometallic complex is removed from the surface of the semiconductor substrate 1, and the high-k insulating film 4 in a state where the high-k insulating film 4 is thinned by the thickness corresponding to one layer of the outermost surface layer of the high-k insulating film 4 is exposed again.

Thereafter, after the temperature of the semiconductor substrate 1 is lowered until it falls below the gas introduction upper limit temperature $T_1$ (period (f)), processing in periods (c) to (f), that is, a series of processing such as the introduction of the mixed etching gas through the gas supply line 15, the uniformity in the surface of the substrate by the slow heating, the generation of the organometallic complex, the discharge of the excess part of the mixed etching gas by the rapid heating under the decompression, and the volatilization removal of the organometallic complex are repeated up to the desired etching depth, such that the isotropic dry removal of the high-k insulating film 4 is completed.

Since the complex-forming gas included in the mixed etching gas reacts only with a specific oxide or a specific halide and does not react with substances having other molecular structures such as a nitride, an etching selective ratio of the oxide to the nitride is kept high. For example, the high etching selective ratio for a silicon nitride (SiN) film or a titanium nitride film (TiN) which is often used in the semiconductor device is exhibited. Further, in the complex stabilizing material gas included in the mixed etching gas, the complex stabilizing effect for the metallic complex made of metal elements of the fourth period and before the fourth period of the periodic table of elements is not high. For this reason, even when the organometallic complex is generated from an oxide (for example, a silicon oxide ($SiO_2$) film) and the like other than the high-k insulating film 4, the organometallic complex does not have high volatility, or the volatility is not efficiently removed as the organometallic complex is thermally decomposable. Therefore, the high etching selective ratio is exhibited between the high-k insulating film and other oxide films.

The details of all the conditions such as the composition ratio of the complex-forming gas and the complex stabilizing material gas which are included in the mixed etching gas, the supply concentration, the supply time, the temperature of the semiconductor substrate 1 at the time of the supply, the time until the temperature rises after the mixed etching gas is supplied need to be appropriately adjusted by the material or the thickness of the high-k insulating film 4 formed on the semiconductor substrate 1, the micro structure of the device and the like. As a general tendency, the etching rate of the mixed etching gas supplied together with the carrier gas tends to be getting faster as the concentration of the mixed etching gas to the carrier gas is high. For this reason, in the etching processing of a deep hole trench or a high aspect pattern, it is preferable to gradually change the component composition or the supply concentration of the mixed etching gas supplied. For example, at the initial stage, the mixed etching gas is supplied at a low concentration, the concentration of the mixed etching gas is gradually increased, and the mixed etching gas having a concentration of 100% is finally supplied. As described above, after the influence of the component composition, the supply concentration, and the supply time of the mixed etching gas, and the substrate temperature is checked, the appropriate processing conditions are determined.

The etching mechanism as described above makes it possible to adopt the vaporizer having a simple configuration like a bubbling type in the semiconductor manufacturing apparatus of the present embodiment. The ratio of the complex-forming gas and the complex stabilizing material gas in the mixed etching gas can be determined by the chemical structure of the organometallic complex to be generated, and even if the ratio between the complex-forming gas and the complex stabilizing material gas is deviated, it does not directly affect the etching performance. In addition, although the materials for the complex-forming gas and the complex stabilizing material gas will be described later, both of them are organic compounds which are liquid at a normal temperature and have a relatively high vapor pressure. Therefore, the limitation of the control accuracy and the restriction of the supply flow rate which have been the problems of the bubbling type vaporizer are not a big problem in the semiconductor manufacturing apparatus of the present embodiment. Rather, as has been conventionally done to supply two or more kinds of gases to the semiconductor manufacturing apparatus, in a system in which separate chemical liquid tanks and vaporizers are installed for each gas component to individually gasify these gas components and a gas mixer mixes each gas component such that the gas components have a specific composition ratio, the problems of increasing the size of the semiconductor manufacturing apparatus, increasing the number of parts and the like tend to be actualized as the number of kinds of mixed gases is increased. In the meantime, in the case of adopting the bubbling type vaporizer, since the discrepancy in the mixing ratio between the complex-forming gas and the complex stabilizing material gas due to the low control accuracy of the vaporizer leads to a waste of the raw material, as illustrated in FIG. 3, the collecting and sorting device is preferably installed to recover the extra raw material.

Next, the raw material for the complex-forming gas which is the component for converting the high-k insulating film into the volatile organometallic complex and the raw material for the complex stabilizing material gas which is the component for increasing the stability of the volatile organometallic complex are described.

The fact that the mixed etching gas of the complex-forming gas and the complex stabilizing material gas is generated by vaporizing the chemical liquid 30 filled in the chemical liquid tank 31 installed in the gas supply line 15 by the vaporizer 32 was described with reference to FIG. 1. In addition, the chemical liquid 30 is a raw material for generating at least two kinds of gaseous component substances, namely, the complex-forming gas and the complex stabilizing material gas, and is the mixed liquid including the raw material for the complex-forming gas and the raw material for the complex stabilizing material gas.

From the viewpoint of the operability and the work efficiency of the process of vaporizing the chemical liquid 30, both of the raw material for the complex-forming gas and the raw material for the complex stabilizing material gas are selected from materials of which the boiling point at 1 atm does not largely exceed approximately 200° C.

The raw material for the complex-forming gas is an organic compound capable of forming at least two or more coordination bonds to a transition metal atom, that is, a so-called multidentate ligand molecule. Preferably, there are diketones or ketoester (including two C=O bonds), ketoimine (including C=O bond and C=N bond) and the like. Specific examples of the substance names may include acetylacetone, trifluoroacetylacetone, trifluorophenyl butadione, hexafluoroacetylacetone, dipivaloylmethane, thenoyltrifluoroacetone, trifluorofurylbutadione, dimethylheptafluorooctadione and the like.

Figure 6:
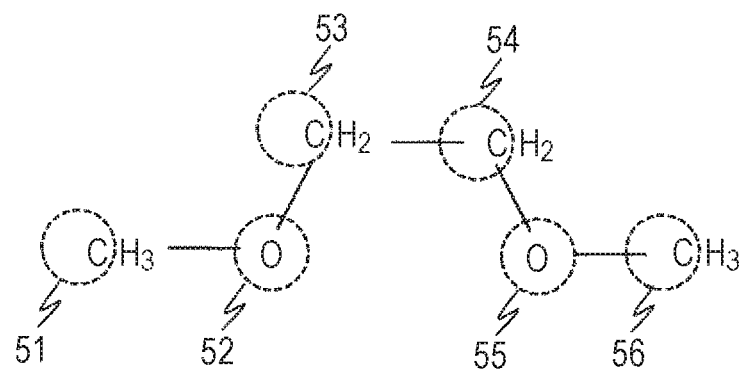
FIG. 6 is a diagram illustrating an example of a material for complex stabilizing material gas.

In addition, the raw material for the complex stabilizing material gas is an organic compound having two or more elements having an unshared electron pair such as an oxygen atom or a nitrogen atom in the molecular skeleton thereof, preferably, five or more atoms except for a hydrogen atom and a fluorine atom. For example, FIG. 6 illustrates a molecular structure of dimethoxyethane. The dimethoxyethane has six atoms 51 to 56 excluding hydrogen atoms and fluorine atoms.

Figure 7:
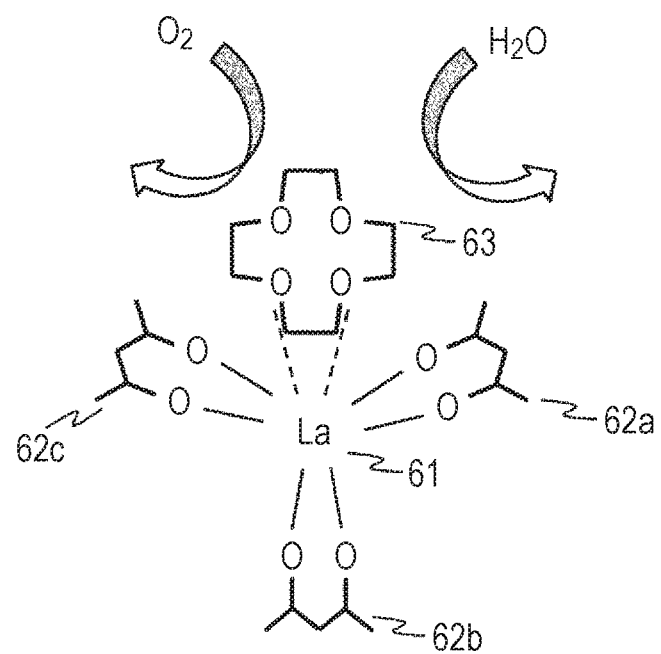
FIG. 7 is a diagram for describing an action of the complex stabilizing material gas.

An action and an effect of the complex stabilizing material gas are described with reference to FIG. 7. The ligands of a transition metal atom (for example, lanthanum (La)) 61 and complex-forming materials 62a to 62c in the high-k insulating film are coordinate bonded to form the organometallic complex. By including the complex stabilizing material gas in the etching gas, an element having an unshared electron pair in the molecule of a complex stabilizing material 63 (for example, oxygen in 12-crown-4 molecules in FIG. 7) is weakly bonded to the transition metal to cancel the coordinative unsaturation of the transition metal atom, thereby increasing the binding stability of the organometallic complex. Further, the complex stabilizing material has a relatively large molecular cross-sectional area to prevent oxygen molecules, water molecules or the like from approaching a central nucleus of the organometallic complex due to the steric hindrance. It is possible to increase the stability of the organometallic complex by these multifunctions.

The raw material for the complex stabilizing material gas is preferably ethers. The ethers are suitable as the raw material for the complex stabilizing material gas from the viewpoint that they do not cause the chemical reaction with the raw material for the complex-forming gas as listed above. A specific example of the substance name for some of the substances may include a straight chain ether such as dimethoxyethane, diethylene glycol dimethyl ether, and propylene glycol dimethyl ether, cyclic ether such as tetrahydrofuran, 12-crown-4, and diaza-12-crown-4, adiponitrile, succinonitrile and the like.

In the case of using hexafluoroacetylacetone (liquefied diketone compound) as the raw material for the complex-forming gas and diethylene glycol dimethyl ether (liquid ether with straight chain) previously dehydrated as the raw material for the complex stabilizing material gas, metal oxides (metal oxides including rare earth elements) including group 3A metals such as lanthanum (La) or yttrium (Y) has high reactivity without reacting with a silicon oxide ($SiO_2$) film, metal such as silicon (Si), stainless steel (SUS), copper (Cu), and tungsten (W), a nitride film such as a titanium nitride (TiN) film or a silicon nitride (SiN) film, and metal fluorides such as yttrium fluoride ($YF_3$). An example thereof is illustrated in FIG. 8. The reaction rate is obtained as a mass ratio of the substance lost by being volatilized by the reaction of the mixed etching gas (complex-forming gas:hexafluoroacetylacetone, complex stabilizing material gas:diethylene glycol dimethyl ether) with the substance with respect to a mass of a substance before the reaction. By doing so, it was confirmed that the mixed etching gas of the present embodiment selectively reacts with the high-k insulating film material to generate the volatile organometallic complex, which is selectively removable under the decompression and heating.

In addition, when the high-k insulating film material and the complex-forming gas react with each other without the complex stabilizing material gas, the defect that residues are caused during the process of desorbing and volatilizing the organometallic complex from the surface of the high-k insulating film material is caused. These residues were a carbon-based impurity generated by decomposing the organometallic complex. Therefore, during the process of the slow heating illustrated in FIG. 5 (period (d)), it is necessary to set the conditions such that the adsorption concentration of the complex stabilizing material gas as well as the complex-forming gas is also uniform in the surface of the semiconductor substrate 1.

What is claimed is:
1. A method for manufacturing a semiconductor device, the method comprising:
    placing, in a processing chamber, a semiconductor substrate on which a mask layer having a predetermined pattern shape is formed on a high-k insulating film;
    desorbing gas or a foreign matter adsorbed on a surface of the semiconductor substrate;

supplying reactive gas to the processing chamber in a state where a temperature of the semiconductor substrate falls below a predetermined temperature;

stopping the supply of the reactive gas and heating the semiconductor substrate; and vaporizing an organometallic complex generated by reacting with a metal element included in the high-k insulating film and exhausting the vaporized organometallic complex from the processing chamber, wherein the reactive gas is mixed gas including complex-forming gas forming the organometallic complex by reacting with the metal element included in the high-k insulating film and complex stabilizing material gas that increases stability of the organometallic complex.

2. The method according to claim 1, wherein the metal element included in the high-k insulating film is a metal element classified in a fifth period and the following periods of a periodic table.

3. The method according to claim 1, wherein the metal element included in the high-k insulating film is a rare earth element.

4. The method according to claim 1, wherein a raw material for the complex-forming gas is an organic compound capable of forming at least two or more coordination bonds to a transition metal atom, that is, a so-called multidentate ligand molecule.

5. The method according to claim 4, wherein the raw material for the complex-forming gas includes any of diketones, ketoester, and ketoimine.

6. The method according to claim 1, wherein a raw material for the complex stabilizing material gas is an organic compound having two or more elements having an unshared electron pair such as an oxygen atom or a nitrogen atom in a molecular skeleton and five or more atoms except for a hydrogen atom and a fluorine atom.

7. The method according to claim 6, wherein the raw material for the complex stabilizing material gas is ethers.

* * * * *